(12) United States Patent
Kray et al.

(10) Patent No.: US 6,750,118 B2
(45) Date of Patent: Jun. 15, 2004

(54) PROCESS AND APPARATUS TO SUBDIVIDE OBJECTS

(75) Inventors: Daniel Kray, Freiburg (DE); Gerhard Willeke, Waldkirch (DE)

(73) Assignee: Fraunhofer-Gesellschaft zur Forderung der angewandten Forschung e.V., Munich (DE)

( * ) Notice: Subject to any disclaimer, the term of this patent is extended or adjusted under 35 U.S.C. 154(b) by 49 days.

(21) Appl. No.: 10/141,299

(22) Filed: May 8, 2002

(65) Prior Publication Data

US 2003/0157784 A1 Aug. 21, 2003

(30) Foreign Application Priority Data

Feb. 16, 2002 (DE) ..................................... 202 02 374 U

(51) Int. Cl.[7] .............................................. H01L 21/44
(52) U.S. Cl. ...................... 438/460; 438/113; 438/114; 216/17; 156/345
(58) Field of Search .......................... 438/113–114, 460, 438/706, 719, 697, 689; 216/16–17; 156/345

(56) References Cited

U.S. PATENT DOCUMENTS 6,284,661 B1 * 9/2001 Yokoyama et al. ......... 438/706

OTHER PUBLICATIONS

"A New Route Towards 50 μm Thin Crystalline Silicon Wafer Solar Cells," Willeke, Gerhard and Kray, Daniel; Paper VCI.57, 17th EU–PVSEC Conference (Oct. 22, 2001).

* cited by examiner

Primary Examiner—Dung Le
(74) Attorney, Agent, or Firm—Volpe and Koenig, P.C.

(57) ABSTRACT

A process and an apparatus used to subdivide objects (4) into slices, in particular to manufacture wafers from semi-conducting monocrystalline blocks, wherein these blocks are subdivided into slices with the help of at least one cutting tool (3), and under the influence of an etchant. Prior to completely cutting and subdividing the object (4) (ingot) into individual slices (wafers), a separating foil (12) is introduced into each cut slit (9) to separate the slices. This efficiently prevents the resultant wafers from sticking together. The individual separation of the wafers is thus accomplished right when the cutting process takes place so that the necessary number of process steps to manufacture silicon wafers is reduced.

14 Claims, 1 Drawing Sheet

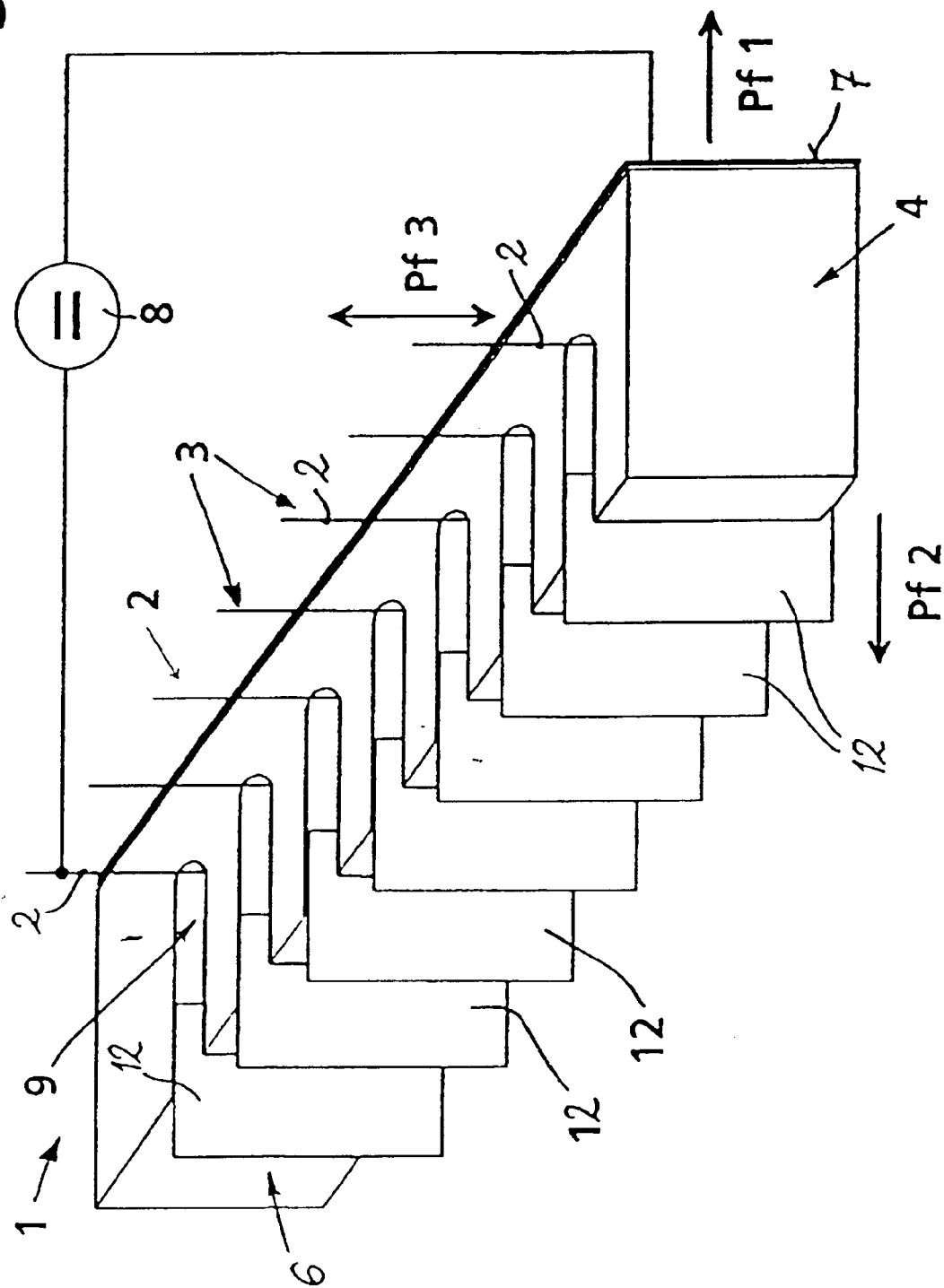

PROCESS AND APPARATUS TO SUBDIVIDE OBJECTS

BACKGROUND

This invention pertains to a process and an apparatus to subdivide objects, in particular to produce wafers from semi-conducting, monocrystalline blocks, wherein these blocks are subdivided into slices with the help of at least one cutting tool and under the influence of an etchant.

The apparatus has a cutter arrangement that has at least one cutting tool and an etchant feed device.

In the solar cell and chip industry, very thin wafers are necessary that have very good electronic properties. Current manufacturing processes deal with the mechanical abrading of an object to be cut containing the monocrystalline block (ingot). What is most commonly used for this is the so-called multi-wire slurry saw (MWSS). This mechanical process results in high surface damages to the silicon, making subsequent etching and cleaning steps necessary, and can lead to increased breaks. In addition, the saw losses are high and the minimum attainable wafer thickness is limited to approximately 200 μm.

Another so-called "stream etching" process is known in which a taut wire is used as the cutting tool. Etchant flows along this wire. The wire and the block to be subdivided are connected to a current source so that the cutting process occurs in a non-contact fashion through electrochemical etching. This process results in wafers with planar, practically undamaged surfaces, with the breakage rate and the cutting losses being minimized, and allowing the manufacture of very thin wafers. The problem with this process is that these thin wafers can stick together by adhesion, making it very difficult to separate them.

SUMMARY

The object of this invention is to provide a process and an apparatus that allows very thin wafers or similar sliced objects to be manufactured while safely and reliably separating them.

To accomplish this object, the process according to the invention proposes to introduce into each slit cut a foil to separate the slices prior to the object (ingot) being completely cut and subdivided into individual slices. It is suggested that the apparatus used for this purpose be provided with one or more foils to be introduced into the respective slit cut, which is produced by the cutting tool or cutting tools, between adjacent slices in the object to be subdivided. These foils are then used to separate the adjacent slices.

This efficiently prevents the resultant wafers from sticking together. The individual separation of the wafers is performed right when the cutting process is performed so that the necessary number of process steps in the manufacturing of silicon wafers is reduced.

It is advantageous for the apparatus to have a foil carrier for one or more separating foils to separate adjacent slices. This carrier has a device to hold the separating foil(s) taught inside the slits cut.

If a foil carrier is provided for a number of adjacent parallel foils, it is preferable to also have an adjustable distance maintainer.

This allows the precise setting and adjustment of the parallelness of the foils if a number of wafers are produced at the same time.

The separating foil(s) are formed, in particular, of a material that is resistant to the etchant used, the temperature present during the process as well as any existing electrical potentials.

It is preferred that the separating foil be made of polytetrafluoroethylene (PTFE).

For the electrochemical cutting of silicon using potassium hydroxide, thin PTFE foils are particularly well suited since they have a very low coefficient of friction, are not wetted by potassium hydroxide and are resistant to potassium hydroxide.

In order to ensure an improved mechanical separation of electrolyte and foils, the separating foil can have at least one exterior side with a profiled or structured surface, in particular with a microstructured surface. If necessary, it can have a reticular structure.

Additional embodiments of the invention are discussed below.

BRIEF DESCRIPTION OF THE DRAWINGS

The preferred embodiment of the invention and the details thereof are explained in more detail with the help of the drawings.

The lone FIGURE shows schematically:

A perspective view of a cutter to subdivide into slices monocrystalline blocks, in particular, using cutting tools formed by wires.

DETAILED DESCRIPTION OF THE PREFERRED EMBODIMENT

A cutter 1 shown in the FIGURE is used to subdivide, particularly into slices, semi-conducting objects. In the preferred embodiment, the cutter 1 has a number of adjacent parallel wires 2 as the cutting tools 3. Also, separators 12, which are separate from the cutting tools 3, are provided that are made of foil.

In the cutting process, the wires are placed in the direct vicinity of the surface of the object 4 to be subdivided. The wires 2 are held taught and are wetted with an etchant fluid that flows down these wires 2 and also wets the surface of the object 4 in the direct vicinity of each of the wires.

The object 4 to be subdivided is provided with a large surface contact electrode 7 opposite the side being cut 6. This contact electrode 7 is connected to a DC power supply 8. The electrically conducting wires 2 are connected to the other side of this power supply. It is also possible to use an AC power supply.

The etching is started locally by activating the DC power supply. The cutting process then proceeds through electrochemical etching.

In the electrochemical etching, a cut slit 9 arises, wherein the distance between the wires 2 is held constant at right angles to the object 4 to be subdivided by moving the object 4 in the direction of arrow Pf 2. This enlarges the cut slit 9 in the cutting direction according to arrow Pf 1. To maintain constant distance between the wire 2 and the object 4, the relative motion is attained by moving the object 4 in the direction of arrow Pf 2.

As shown schematically in the FIGURE, adjacent wires 2 next to one another are provided as the cutting tools, and foils act as separate separators 12 that are some distance away from the cutting tool 3 (wire). During the cutting process, these separator foils are brought approximately centered into the respective slit cut and are at enough of a distance from the wire 2 that they are not wetted with etchant.

Polytetrafluoroethylene can be used as the preferred material for the separator foils because these types of foils have a very low coefficient of friction, are not wetted by, for example, potassium hydroxide as etchant fluid and are also resistant to these etching fluids.

In order to prevent the foil separators 12 from sticking to the cut surfaces of the object 4 near the cut slit 9, the foils can have one or both external sides with a profiled or structured surface, in particular a microstructured surface. If necessary, it can also have a reticular structure in order to ensure an improved mechanical separation of electrolyte and foil.

Instead of a wire, a strip can also be used as cutting tool 3, in particular a foil strip. In the process, the foil strip can serve both to separate the two adjacent slices and as a cutting tool. This prevents the thin slices from sticking together.

It is useful to have this foil extend at least over a large portion of the cut surface of the object to be subdivided in order to prevent adhesion throughout practically the entire cut zone.

What is claimed is:

1. A process to subdivide objects for production of wafers from semi-conducting, monocrystalline blocks, comprising subdividing the blocks into slices with at least one cutting tool and an etchant, and introducing a separating foil into each slit cut to separate the slices prior to complete cutting and subdivision of the object into the individual slices.

2. The process according to claim 1, further comprising moving the separating foil into the slit cut outside of an etchant wetting zone without touching the subdivided object.

3. The process according to claim 1, wherein the separating foil moves approximately centered in the respective slit cut of the object.

4. The process according to claim 1, wherein the separating foil moves at a distance from the respective cutting tool.

5. An apparatus to subdivide objects into slices, to manufacture wafers from semi-conducting monocrystalline blocks, comprising a cutter having at least one cutting tool and an etchant feed device, and one or more separating foils provided to separate adjacent slices, the foils being introduced into each slit cut between adjacent slices in the object to be subdivided.

6. The apparatus according to claim 5, further comprising a foil carrier for the one or more separating foils to separate the adjacent slices, the carrier having a device to hold the separating foils tight inside of the slits cut.

7. The apparatus according to claim 6, wherein the foil carrier has an adjustable distance maintainer for multiple parallel adjacent separating foils.

8. The apparatus according to claim 5, wherein the separating foil is formed of an etchant resistant material that can withstand a temperature present during processing as well as any existing electrical potentials.

9. The apparatus according to claim 5, wherein the separating foil is comprised of polytetrafluoroethylene (PTFE).

10. The apparatus according to claim 5, wherein the separating foil has at least one exterior side with at least one of a profiled surface, structured surface, a microstructured surface and a reticular structure.

11. The apparatus according to claim 5, wherein the separating foil is adapted to extend at least over a large portion of a respective cut surface in the block to be subdivided.

12. The apparatus according to claim 5, wherein a wire is provided as the cutting tool.

13. The apparatus according to claim 5, wherein a strip is provided as the cutting tool.

14. The apparatus according to claim 13, wherein the strip is a the foil strip that is used as the cutting tool and extends at least over a large portion of a cut surface in the object to be subdivided.

* * * * *